United States Patent [19]
Hause et al.

[11] Patent Number: 5,899,727
[45] Date of Patent: May 4, 1999

[54] METHOD OF MAKING A SEMICONDUCTOR ISOLATION REGION BOUNDED BY A TRENCH AND COVERED WITH AN OXIDE TO IMPROVE PLANARIZATION

[75] Inventors: Fred N. Hause; Basab Bandyopadhyay; H. Jim Fulford, Jr.; Robert Dawson, all of Austin; Mark W. Michael, Cedar Park; William S. Brennan, Austin, all of Tex.

[73] Assignee: Advanced Micro Devices, Inc., Sunnyvale, Calif.

[21] Appl. No.: 08/642,155

[22] Filed: May 2, 1996

[51] Int. Cl.⁶ .................................................. H01L 21/76
[52] U.S. Cl. ........................................... 438/444; 438/448
[58] Field of Search .................... 437/72; 148/DIG. 117, 148/DIG. 85, DIG. 86; 438/444, FOR 232, 448

[56] References Cited

U.S. PATENT DOCUMENTS

| | | |
|---|---|---|
| 4,211,582 | 7/1980 | Horng et al. . |
| 4,274,909 | 6/1981 | Venkataraman et al. . |
| 4,385,975 | 5/1983 | Chu et al. . |
| 4,390,393 | 6/1983 | Ghezzo et al. . |
| 4,445,967 | 5/1984 | Kameyama . |
| 4,532,701 | 8/1985 | Kameyama et al. . |
| 4,671,970 | 6/1987 | Keiser et al. . |
| 4,868,136 | 9/1989 | Ravaglia . |
| 4,871,685 | 10/1989 | Taka et al. . |
| 4,873,203 | 10/1989 | Kaga et al. . |

(List continued on next page.)

FOREIGN PATENT DOCUMENTS

| | | |
|---|---|---|
| 0300569 | 1/1989 | European Pat. Off. . |
| 0461498 | 12/1991 | European Pat. Off. . |
| 56-140641 | 11/1981 | Japan . |
| 57-91535 | 6/1982 | Japan . |
| 58-42251 | 3/1983 | Japan . |
| 58-220444 | 12/1983 | Japan . |
| 59-87831 | 5/1984 | Japan . |
| 0186342 | 10/1984 | Japan . |
| 0015944 | 1/1985 | Japan . |
| 60-38831 | 2/1985 | Japan . |
| 61-85838 | 5/1986 | Japan . |
| 61-166042 | 7/1986 | Japan . |
| 2-140951 | 5/1990 | Japan . |
| 0272745 | 11/1990 | Japan . |
| 0062946 | 3/1991 | Japan . |
| 3-96249 | 4/1991 | Japan . |
| 0190663 | 7/1993 | Japan . |

OTHER PUBLICATIONS

IBM Technical Disclosure Bulletin, "Forming Wide Trench Dielectric Isolation", Apr. 1983, 2 pages.

Wolf, "Silicon Processing For The VLSI Era, vol. 1, Process Technology", Lattice Press, 1986, pp. 407–458.

*Primary Examiner*—George Fourson
*Attorney, Agent, or Firm*—Conley, Rose & Tayon; Robert C. Kowert; Kevin L. Daffer

[57] ABSTRACT

An isolation technique is provided for improving the overall planarity of isolation regions relative to adjacent active area silicon mesas. The isolation process results in a trench formed in field regions immediately adjacent the active regions. The trench, however, does not extend entirely across the field region. By preventing large area trenches, substantial dielectric fill material and the problems of subsequent planarization of that fill material is avoided. Accordingly, the present isolation technique does not require conventional fill dielectric normally associated with a shallow trench process. While it achieves the advantages of forming silicon mesas, the present process avoids having to rework dielectric surfaces in large area field regions using conventional sacrificial etchback, block masking and chemical-mechanical polishing. The improved isolation technique hereof utilizes trenches of minimal width etched into the silicon substrate at the periphery of field regions, leaving a field mesa. A field dielectric, preferably oxide, is formed upon the field mesa and fills trenches between the field mesa and active mesas, leaving a substantially planar field dielectric commensurate with the upper surface of adjacent active mesas.

18 Claims, 5 Drawing Sheets

U.S. PATENT DOCUMENTS

| | | |
|---|---|---|
| 4,906,585 | 3/1990 | Neppl et al. . |
| 4,952,524 | 8/1990 | Lee et al. . |
| 4,980,311 | 12/1990 | Namose . |
| 4,994,406 | 2/1991 | Vasquez et al. . |
| 5,004,703 | 4/1991 | Zdebel et al. . |
| 5,011,788 | 4/1991 | Kawaji et al. . |
| 5,096,848 | 3/1992 | Kawamura . |
| 5,175,122 | 12/1992 | Wang et al. . |
| 5,225,358 | 7/1993 | Pasch . |
| 5,229,315 | 7/1993 | Jun et al. . |
| 5,229,316 | 7/1993 | Lee . |
| 5,231,046 | 7/1993 | Tasaka . |
| 5,242,689 | 9/1993 | Cronin . |
| 5,294,562 | 3/1994 | Lur et al. . |
| 5,308,784 | 5/1994 | Kim et al. . |
| 5,308,786 | 5/1994 | Lur . |
| 5,371,036 | 12/1994 | Lur et al. . |
| 5,372,950 | 12/1994 | Kim et al. . |
| 5,372,968 | 12/1994 | Lur et al. . |
| 5,691,252 | 11/1997 | Pan . |
| 5,696,020 | 12/1997 | Ryum et al. . |

METHOD OF MAKING A SEMICONDUCTOR ISOLATION REGION BOUNDED BY A TRENCH AND COVERED WITH AN OXIDE TO IMPROVE PLANARIZATION

BACKGROUND OF THE INVENTION

1. Field of the Invention

This invention relates to semiconductor fabrication and more particularly to an improved process of planarizing a field dielectric upper surface commensurate with adjacent active regions. The improved planarization process involves etching trenches about the field region to form field mesas, and then oxidizing the field mesas and trenches to produce a field dielectric which extends in planar fashion entirely across the field region.

2. Description of the Relevant Art

The fabrication of an integrated circuit involves placing numerous devices in a single semiconductor substrate. Select devices are interconnected by a conductor which extends over a dielectric which separates or "isolates" those devices. Implementing an electrical path across a monolithic integrated circuit thereby involves selectively connecting isolated devices. When fabricating integrated circuits it must therefore be possible to isolate devices built into the substrate from one another. From this perspective, isolation technology is one of the critical aspects of fabricating a functional integrated circuit.

A popular isolation technology used for an MOS integrated circuit involves the process of locally oxidizing silicon. Local oxidation of silicon, or LOCOS process involves oxidizing field regions between devices. The oxide grown in field regions are termed field oxide, wherein field oxide is grown during the initial stages of integrated circuit fabrication, before source and drain implants are placed in device areas or active areas. By growing a thick field oxide in isolation (or field) regions pre-implanted with a channel-stop dopant, LOCOS processing serves to prevent the establishment of parasitic channels in the field regions.

While LOCOS has remained a popular isolation technology, there are several problems inherent with LOCOS. First, a growing field oxide extends entirely across the field region and laterally as a bird's-beak structure. In many instances, the bird's-beak structure can unacceptably encroach into the device active area. Second, the pre-implanted channel-stop dopant oftentimes redistributes during the high temperatures associated with field oxide growth. Redistribution of channel-stop dopant primarily affects the active area periphery causing problems known as narrow-width effects. Third, the thickness of field oxide causes large elevational disparities across the semiconductor topography between field and active regions. Topological disparities cause planarity problems which become severe as circuit critical dimensions shrink. Lastly, thermal oxide growth is significantly thinner in small field (i.e., field areas of small lateral dimension) regions relative to large field regions. In small field regions, a phenomenon known as field-oxide-thinning effect therefore occurs. Field-oxide-thinning produces problems with respect to field threshold voltages, interconnect-to-substrate capacitance, and field-edge leakage in small field regions between closely spaced active areas.

Many of the problems associated with LOCOS technology are alleviated by an isolation technique known as the "shallow trench process". Despite advances made to decrease bird's-beak, channel-stop encroachment and non-planarity, it appears that LOCOS technology is still inadequate for deep submicron MOS technologies. The shallow trench process is better suited for isolating densely spaced active devices having field regions less than one micron in lateral dimension.

The trench process involves the steps of etching a silicon substrate surface to a relatively shallow depth, e.g., between 0.2 to 0.5 microns, and then refilling the shallow trench with a deposited dielectric. Some trench processes include an interim step of growing oxide on trench walls prior to the trench being filled with a deposited dielectric. After the trench is filled, it is then planarized to complete the isolation structure.

The trench process eliminates bird's-beak and channel-stop dopant redistribution problems. In addition, the isolation structure is fully recessed, offering at least a potential for a planar surface. Still further, field-oxide thinning in narrow isolation spaces does not occur and the threshold voltage is constant as a function of channel width.

While the trench isolation process has many advantages over LOCOS, it cannot in all instances achieve complete global planarization across the entire semiconductor topography. The upper surface of fill dielectric in large isolation areas are generally at lower elevational levels than the upper surface fill dielectric in small isolation areas. The fill dielectric readily deposits in small area trenches such that the elevation of the fill dielectric in a small area is greater than the elevation within a large area trench. Accordingly, subsequent processing is needed to bring the large area fill topography to the same elevational level as small area fill topography.

Most researchers have focused upon fairly complex processes for planarizing large and small area fill dielectrics. Those processes generally involve rework of the fill dielectric. A popular rework technique involves depositing a sacrificial layer across the fill dielectric topography, and then removing the sacrificial layer at the same etch rate as the underlying dielectric. Generally, the sacrificial layer is deposited as a low-viscosity liquid. Baking the liquid, or exposing it to ultraviolet light, causes the liquid to convert to solid form in a sol-gel reaction. Popular sacrificial materials include photoresist, polyimide or spin-on glass (SOG). The sacrificial layers generally etch back in a plasma until the topmost regions of the fill dielectric are exposed. The etch chemistry is then modified so that the sacrificial layer material and the underlying fill dielectric are etched at approximately the same rate. The etch is continued until all of the sacrificial layer has been etched away, leaving a somewhat planar dielectric upper surface.

The sacrificial etchback technique is generally valid only for the planarization of topographies in which features are less than 10 $\mu$m (microns) apart. For large regions between trenches, the step height will not be reduced, since the photoresist thickness on top of such features will be the same as the thickness over the adjacent trench.

In an effort to overcome the shortcomings of the etchback process, a planarization block mask may be used. In this procedure, a liquid material is applied and developed as a planarization film followed by a block mask used to expose and develop this film. The block mask protects topography in wide, low regions from a subsequent etch plasma. The upper surface of high regions can then be removed to an elevational level commensurate with the protected low regions. The planarization block mask involves an additional lithography step and a mask which is produced by selectively reversing the mask used in producing the underlying topography. Mask reversal may involve errors due to changes in the resist thickness caused by the underlying pattern, misalignment, etc.

In an effort to eliminate the complex deposition, patterning and etch processes involved with sacrificial deposition, etch back, and the block masking, many manufacturers have directed their attention to chemical-mechanical polishing (CMP). Application of a chemical slurry and an abrasive polishing pad across the entire semiconductor topography, allows planarization of that topography commensurate with the planarity of the pad surface. Unfortunately, however, when force is applied to a pad, the pad will oftentimes conform to the unevenness of that topography. Thus, while high elevation areas, or peaks, receive substantial polishing, low elevational areas (or valleys) are also abraded.

Figure 1:
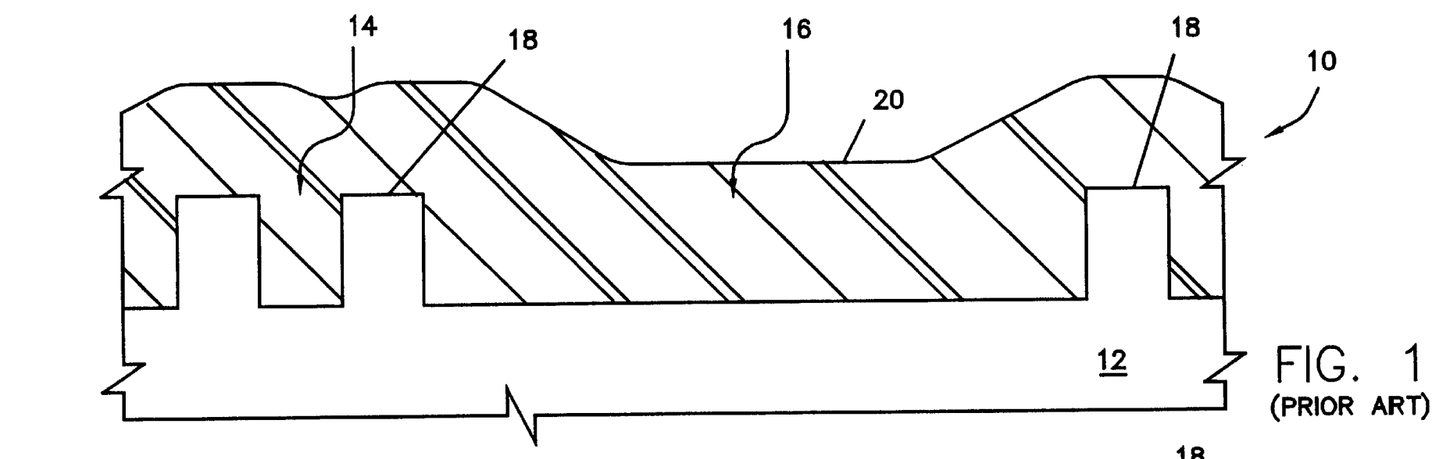
FIG. 1 is a partial cross-sectional view of a semiconductor topography with fill dielectric deposited upon and between active mesas formed according to a conventional shallow trench process.
Figure 2:
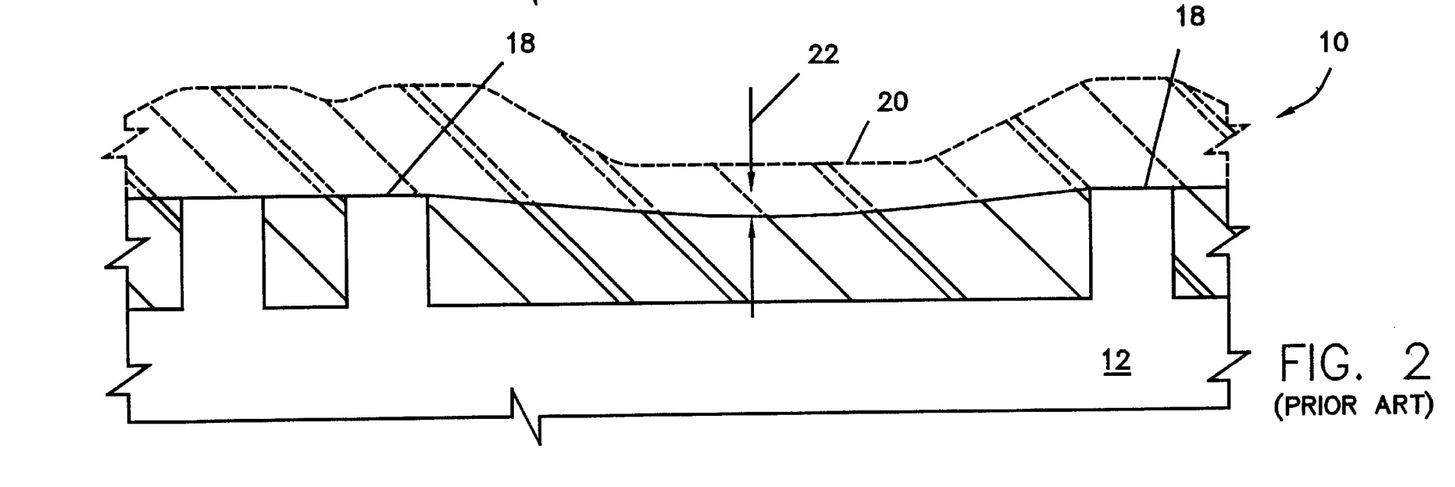
FIG. 2 is a processing step subsequent to that of FIG. 1, wherein the upper topography of fill dielectric is removed to uneven planarization levels according to a conventional CMP process.

A better understanding of the problems inherent with CMP are illustrates in reference to FIGS. 1 and 2. FIG. 1 depicts a partial cross-section of a semiconductor topography 10. Topography 10 includes a substrate 12 which has been fashioned with a small area trench 14 and a large area trench 16 according to the trench isolation process. Trenches 14 and 16 define field areas between active regions, wherein active regions are defined as silicon mesas 18 which extend from an elevation equivalent to the trench base. Deposited upon and between mesas 18 is a fill dielectric 20.

FIG. 2 illustrates a processing step subsequent to that shown in FIG. 1. Specifically, the upper surface of fill dielectric material 20 receives CMP. The polishing pad inherently flexes or conforms under pressure to the upper surface of dielectric 20, causing the polishing pad to attack and remove dielectric 20 upper surface in large area trench 16, albeit to a lesser degree than the removal of dielectric 20 in small area trench 14. If dielectric in large area trench 16 is not sufficiently thick to withstand the attack, the dielectric upper surface will be removed below the desired planar elevation. Thus, a slight recess of dielectric 20 upper surface occurs at the conclusion of CMP. That recess is shown as reference numeral 22. Isolated mesas may also show erosion of the silicon surface due to CMP.

A need therefore exists in producing a process which can utilize the advantages of the shallow trench isolation technique. The desired process must, however, not bear the disadvantages of a non-planar shallow trench. More specifically, an improved process must be derived which does not produce the problems inherent in using a fill dielectric followed by planarization rework. Thus, the desired process must be one which avoids having to use, for example, a sacrificial etchback, block mask and/or CMP.

Avoiding conventional planarization processes thereby avoids the problems of not being able to achieve complete global planarization. Global planarization is defined as the planarization of the field dielectric between active areas, regardless of the relative size differences and densities between field region areas. More specifically, a process must be derived which can planarize field dielectric in large isolation regions as well as small isolation regions. Large area field regions are those defined as having a width or length greater than 16.0 microns. Field regions are defined as those regions which do not contain active devices. All active devices (e.g., transistors, etc.) are formed in active regions which reside between field regions. A need therefore exists for forming a field dielectric upper surface that is substantially planar and equivalent to all other field dielectric and active area upper surfaces which extend across the entire wafer topography. The desired process thereby achieves global planarization with minimal planarization steps.

SUMMARY OF THE INVENTION

The problems outlined above are in large part solved by an improved shallow trench process of the present invention. The improved process hereof serves to form silicon mesas in active areas by forming a trench of defined width immediately adjacent the periphery of each active area. The trench is etched into the silicon substrate within the field region, leaving a silicon mesa in each active region, but also leaving a silicon mesa in a field region. A silicon mesa within an active region is herein defined as an "active mesa" and a silicon mesa within a field region is herein defined as a "field mesa". Thus, instead of forming a trench entirely across the field region as in conventional processes, the present process forms a narrow trench only at the periphery of the field region.

The field mesa can be of varying size, depending upon the field region dimension. Accordingly, in large field regions, the field mesa is also large. In small field regions, the field mesa can be small, or non-existent. In all instances, the trench formed within the field region, at the juncture between active and field regions is of a pre-defined width. The trench width is fixed, preferably between 0.1 to 1.0 microns. The fixed, defined width of the trench is necessary to ensure a trench fill during subsequent field dielectric formation.

The field mesa includes an upper surface which is substantially planar with respect to the laterally spaced active mesas. The field mesa upper surface, being silicon, allows growth of planarizing (and/or fill) dielectric material thereon. The field dielectric is placed upon the field mesa and in trenches which surround each field mesa in a step subsequent to the step used in forming the field mesa. The field dielectric serves to prevent inversion of the field area by a powered, overlying interconnect. The field dielectric extends between active area silicon mesas, entirely across the dielectric-filled trenches and dielectric-covered field mesas.

Preferably, the field dielectric is a thermally grown oxide. The oxide forms as a result of removing an oxide barrier layer from the field mesas but not from the silicon mesas in active areas. When the field oxide grows, a curvature occurs at the field oxide upper surface immediately adjacent the active area. Presence of the curvature serves to minimize the elevational step of an interconnect extending from the active region to the field region. Preferably, the field oxide is grown to a thickness of 0.2 to 0.4 microns. As the field oxide grows, it partially consumes the field mesa upper and sidewall surfaces leaving a larger critical dimension between the silicon field areas and overlying interconnect extending into active regions.

Broadly speaking, the present invention contemplates a method for forming a field dielectric. The method includes the steps of providing a silicon substrate having a field region bounded by at least one active region. A trench is then formed of defined width within the field region immediately adjacent the active region to form a field mesa. The field mesa is completely bounded by the trench. A field dielectric is then grown upon the field mesa and within the trench. The resulting field dielectric thereby includes an upper surface which is substantially planar across the field region commensurate with, and slightly above, the upper surface of the active region. Advantageously, the field dielectric is planar across the field mesa, regardless of the field mesa lateral area. As such, the present method achieves a field dielectric upper surface which is at substantially the same elevation entirely across the field area, regardless of field area size.

The present invention further contemplates a field region comprising a field mesa extending from a silicon substrate a lateral spaced distance from an active area. The field region further includes a field dielectric which covers the field mesa and fills the lateral spaced distance between the field mesa and the active area.

Still further, the present invention contemplates a field region comprising a trench extending into a silicon substrate about the periphery of the field region to form a field mesa. A field dielectric is configured across the field mesa and the trench. The field dielectric thereby fills the trench and leaves a substantially planar upper surface which extends entirely across the field region.

BRIEF DESCRIPTION OF THE DRAWINGS

Other objects and advantages of the invention will become apparent upon reading the following detailed description and upon reference to the accompanying drawings in which.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Figure 3:
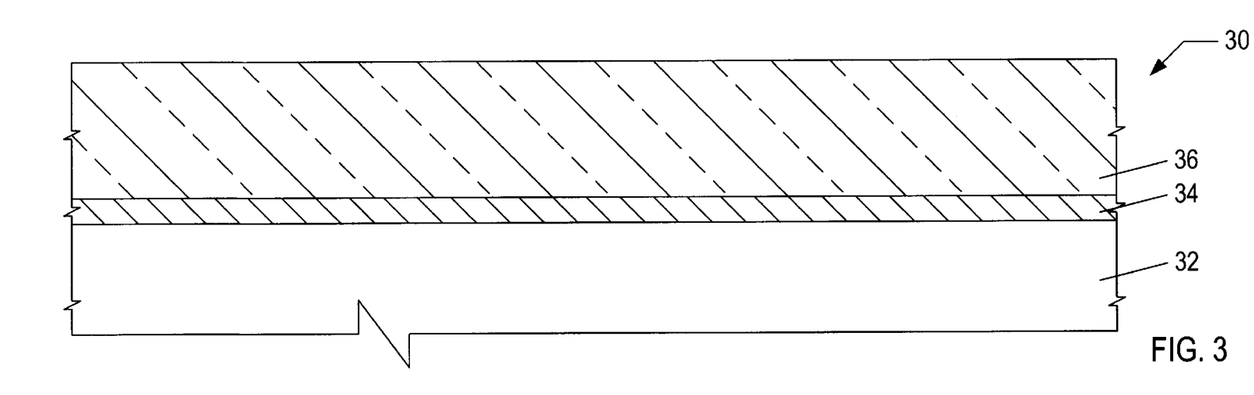
FIG. 3 is a partial cross-sectional view of a semiconductor topography with photoresist applied across the topography according to an exemplary embodiment of the present invention.

Turning now to the drawings, FIG. 3 is a partial cross-sectional view of a semiconductor topography 30. Topography 30 includes a substrate 32, upon which a protective layer 34 is formed. Deposited across the entire protective layer is a photoresist layer 36. Substrate 32 is preferably made from a single crystal silicon. Protective layer 34 comprises any layer which protects the silicon surface from etch materials and/or oxidation, and photoresist 36 includes any material which can selectively polymerize when exposed to ultraviolet light. Topography 30 can include any topography from which an integrated circuit such as metal oxide semiconductor (MOS) is fashioned.

Figure 4:
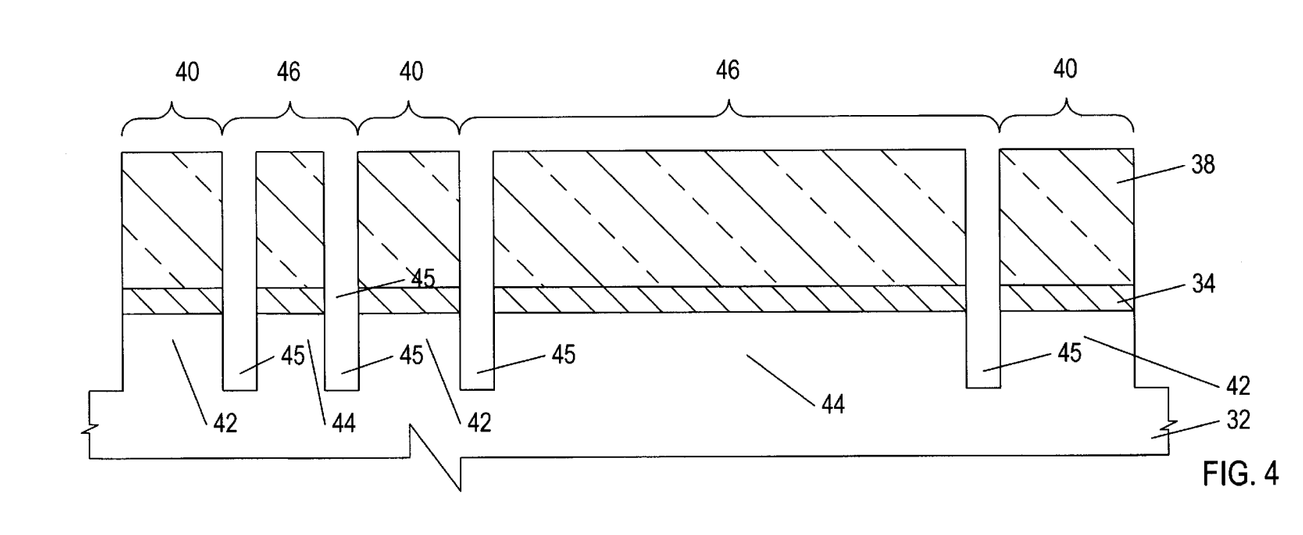
FIG. 4 is a processing step subsequent to FIG. 3, wherein the photoresist is patterned and trench regions of fixed, pre-defined width are formed at the periphery of the field regions resulting in field mesas.

FIG. 4 illustrates a processing step subsequent to FIG. 3. Specifically, a pattern is printed upon photoresist 36, and select regions are exposed and developed. The polymerized regions of photoresist 36 are represented as reference numerals 38. Polymerized photoresist 38 protects the underlying material from etchant. Some of the areas protected by photoresist 38 include active regions 40. Active regions 40 represent areas where transistors will be formed, and are generally designated in areas exclusive of field regions 46.

The patterned photoresist allows etchant to remove between, e.g. 0.2 to 1.0 microns of substrate material 32. The removed regions are designated as trenches, and the non-removed regions are designated as either active mesas 42 or field mesas 44. Active mesas 42 exist only in active regions 40, while field mesas 44 exist only in field regions 46. Trenches 45 are placed in field regions 46, and specifically at the outer periphery of each field region 46. Trenches 45 are each of the same width, preferably between 0.1 to 1.0 microns. Trenches 45 exist only within field region 46, at the juncture between field mesas 44 and active mesas 42. Accordingly, the lateral dimensions of active mesas 42 are defined by the size and quantity of various devices placed therein; however, the lateral dimensions of field mesas 42 depend upon the size of corresponding field regions 46.

If, for example, a large field region is encountered, then given the fixed width of trench 45, field mesas 44 will also be quite large. A large field mesa 44 is defined as one having a lateral area in which active regions 40 on opposing sides of the field mesa are, for example, spaced more than 5.0 to 16.0 microns apart. Small field mesas are generally defined as ones between active areas spaced less than 5.0 to 16.0 microns, and more likely between 1.0 to 5.0 microns apart. In many instances, the spacings between active areas may be less than 1.0 microns, in which case sufficient real estate may not be available to form a field mesa therebetween. In this instance, trench 45 formed adjacent the closely spaced active areas 40 will substantially merge to prevent the occurrence of a field mesa.

Figure 5:
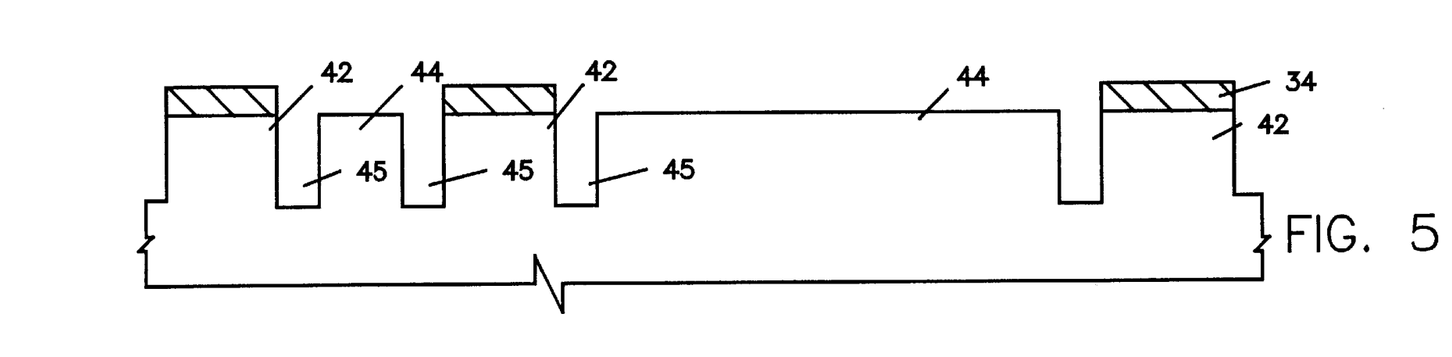
FIG. 5 is a processing step subsequent to FIG. 4, wherein the entire photoresist layer is removed, and select portions of underlying protectant layer are removed from the field mesas.

Referring to FIG. 5, a processing step subsequent to FIG. 4 is shown. FIG. 5 illustrates removal of patterned photoresist 38 from field mesas 44 and active mesas 42. Protective layer 34 is removed only from field mesas 44, and not from active mesas 42.

Figure 6:
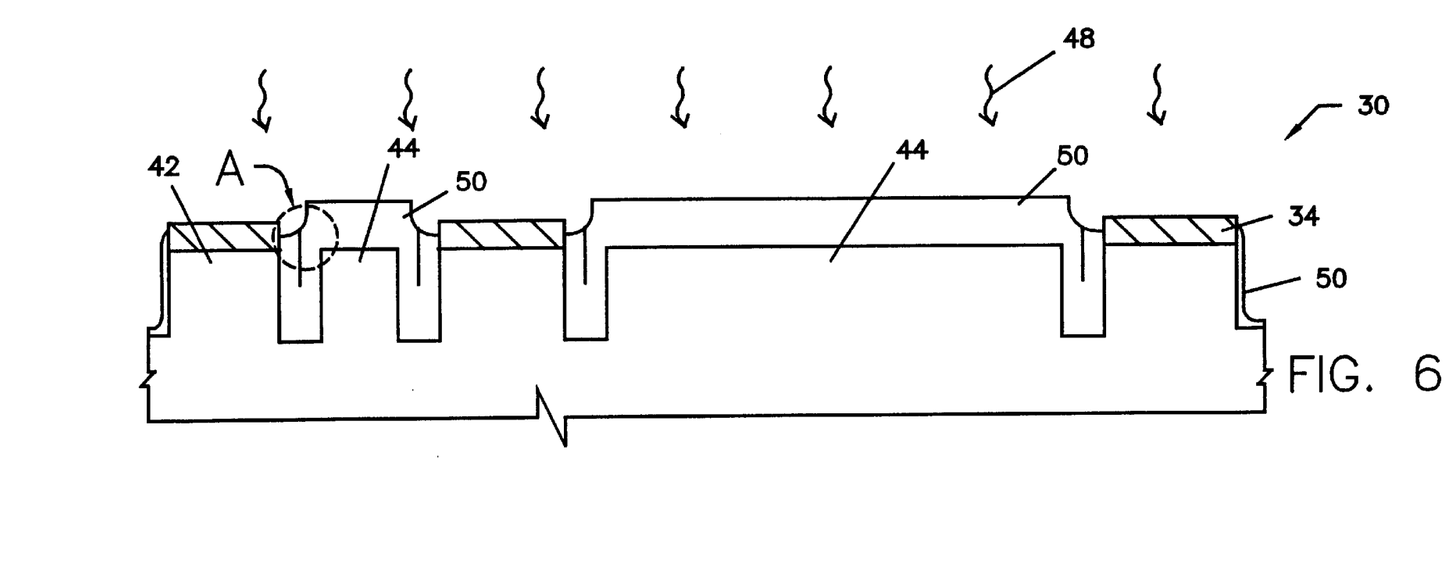
FIG. 6 is a processing step subsequent to FIG. 5, wherein a field dielectric is formed entirely across the field mesas and in trench regions which bound each field mesa.

FIG. 6 illustrates a processing step subsequent to that shown in FIG. 5. The exposed regions of topography 30, i.e., regions absent protective layer 34 allow accumulation of a field dielectric 50 thereon. According to one embodiment, field dielectric 50 comprises an oxide. The oxide is formed from an oxidizing ambient, and in the presence of thermal energy shown by reference numeral 48. The oxidizing ambient causes dielectric 50 to grow upon and within the upper surface and sidewalls of field dielectric 50. Protective layer 34, however, is substantially impermeable to the oxidizing ambient and thereby prevents growth of dielectric 50 upon or below the protective layer. Typically, for an oxide thickness of t, 0.45 t of silicon would be consumed, and the oxide surface will rise approximately 0.55 t above the original silicon surface of field mesa 44. As an example, if trench 45 width is 3000 angstroms, then for the trench width to be completely filled with grown oxide, approximately 2730 angstroms of oxide must be grown upon and within the trench sidewall. Accordingly, for the above example, approximately 2730 angstroms of dielectric 50 exists at the upper surface of field mesas 44. It is important that trench 45 width be constant by an amount which can be readily filled with sufficient dielectric thickness to prevent capacitive coupling of overlying interconnect to underlying field areas. The above example provides 2730 angstroms of field oxide thickness, which in most instances prevents field inversion of a powered interconnect placed thereon. The field oxide thickness can certainly be enhanced by increasing the exposure time and/or thermal energy to provide even further protection against field inversion.

Figure 7:
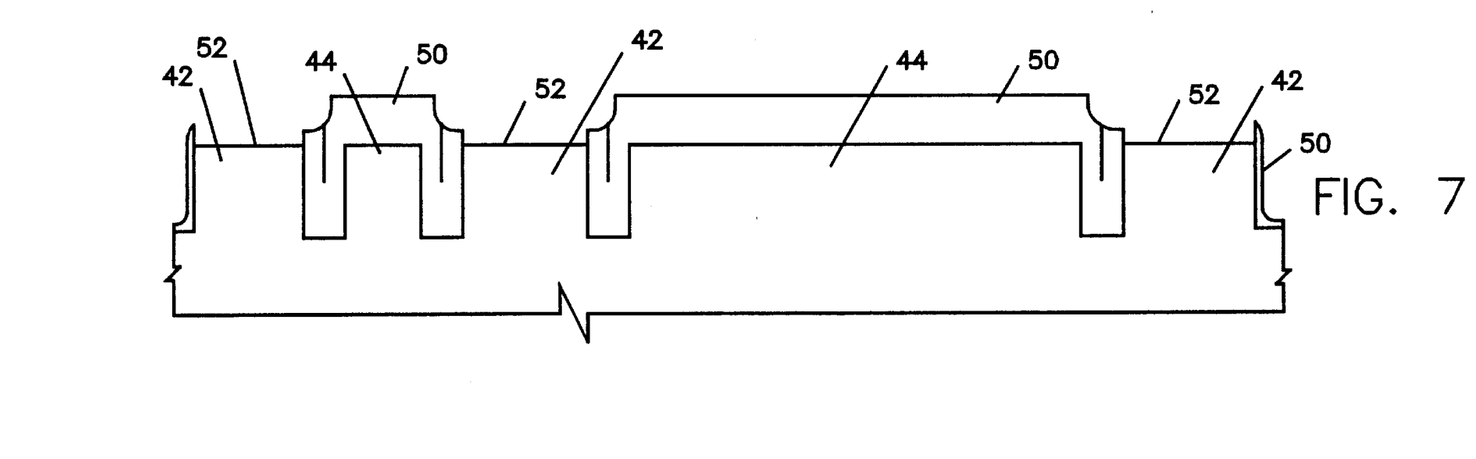
FIG. 7 is a processing step subsequent to FIG. 6, wherein the remaining portions of the protectant layer are removed.

Turning now FIG. 7, a processing step is shown whereby the remaining protective layer 34 is removed. Specifically, protective layer 34 is removed from active mesas 42, leaving a silicon surface upon and within which active devices are formed. Receptive to gate oxide, polysilicon and source/drain implants, the active mesa silicon surface is denoted in FIG. 7 as reference numeral 52.

Figure 8:
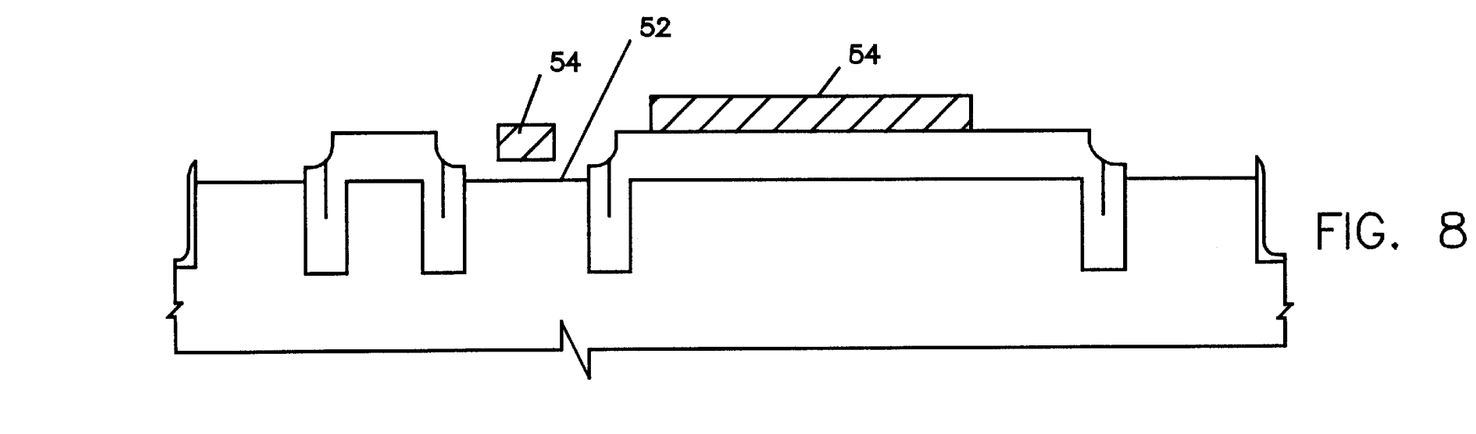
FIG. 8 is a processing step subsequent to FIG. 7, wherein an exemplary conductor is formed upon the field dielectric and active mesas.

FIG. 8 illustrates a processing step subsequent to FIG. 7, wherein a conductor 54, fashioned from an interconnect layer, is formed upon field dielectric 50 and is formed a spaced distance above active area surface 52. Conductor 54 can, according to one embodiment, comprise a polysilicon material. Alternatively, conductor 54 can comprise a refractory metal, or metal silicide. Conductor 54 can extend partially across or entirely across the field region, and can include a gate conductor arranged only partially across an active region. Field dielectric 50 thereby suffices to prevent field inversion during times when conductor 54 receives an operating voltage.

Figures 9, 10:
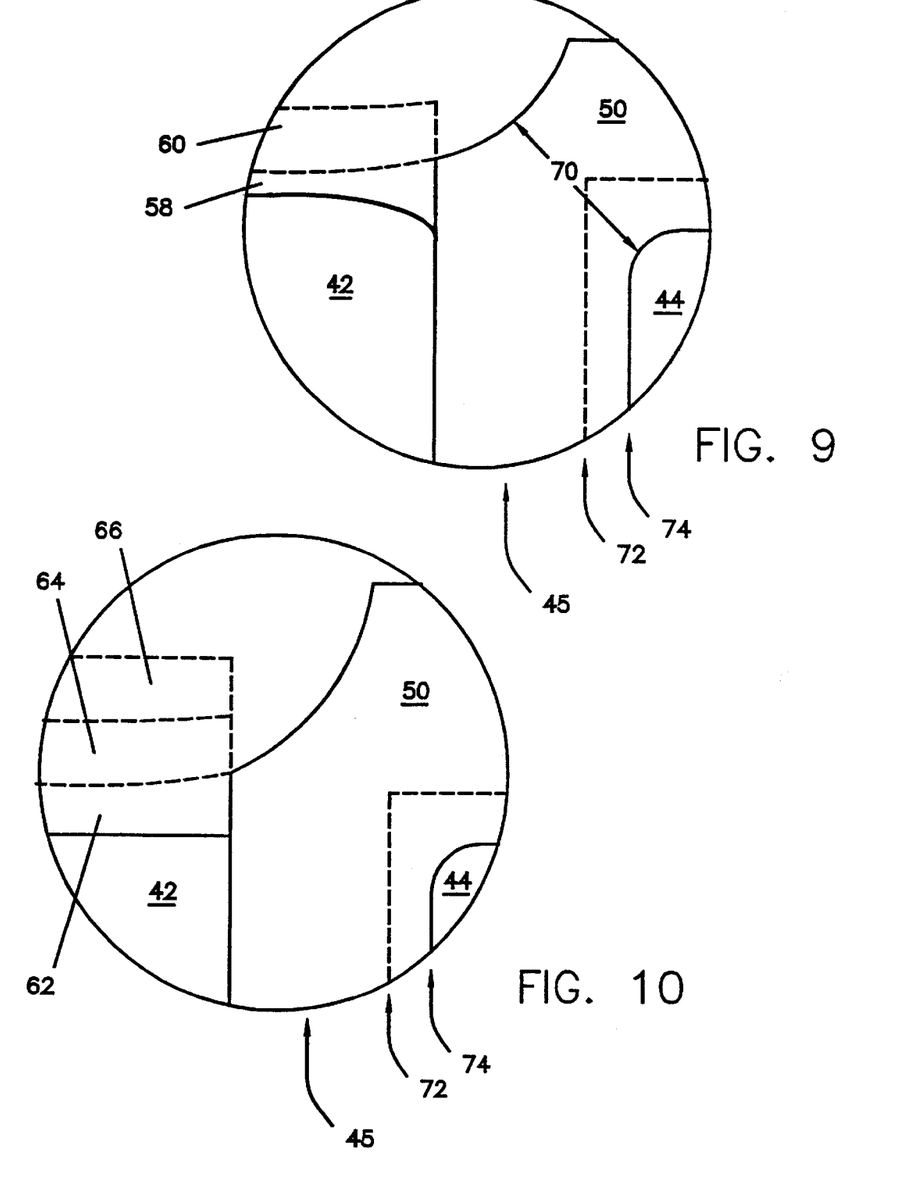
FIG. 9 is a detailed view along area A of FIG. 6 according to one exemplary embodiment.
FIG. 10 is a detailed view along area A of FIG. 6 according to another exemplary embodiment.

Turning now to FIGS. 9 and 10, a detailed illustration along area A of FIG. 6 is shown according to alternative embodiments. FIG. 9 illustrates a corner and sidewall portion of field mesa 44 as well as active mesa 42. Field mesa 44 and active mesa 42 are separated by trench 45. Arranged upon active mesa 42, according to one embodiment, is a pad oxide 58 and a nitride 60. According to another embodiment, formed upon active mesa 42 is a tri-layer structure comprising pad oxide 62, polysilicon 64 and nitride 66. FIG. 9 illustrates one embodiment, whereas FIG. 10 illustrates the other. In either instance, the bi- or tri-layer structure represents the protective layer set forth hereinabove.

In a processing step subsequent to FIG. 6, oxide and nitride layers 58 and 60 are removed, as shown by the dashed lines in FIG. 9. However, prior to removal, field dielectric 50 within trench 45 causes a consumption of silicon at the corner of active mesas 42. Accordingly, active mesa 42 appears slightly rounded at its corner after layers 58 and 60 are removed. Pad oxide 58, nonetheless, allows growth of field dielectric 50 in the form shown, having a critical dimension 70. Critical dimension 70 is defined as the spacing between field mesa corner 44 and the closest upper surface of field dielectric 50. Interconnect which resides upon field dielectric 50 at the field/active area juncture encounters maximum capacitive coupling to field mesa 44 along critical dimension 70. Critical dimension 70, however, according to the present process is at or near the thickness of field dielectric 50 directly above field mesa 44. Enhancement of critical dimension 70 is due in part to the consumption of silicon at the field mesa corner. Any coupling arising between interconnect above trench 45 is thereby minimized.

According to an alternative embodiment, active mesa 42 includes a tri-layer structure described above and shown in FIG. 10. The tri-layer structure of pad oxide 62, polysilicon 64 and nitride 66 helps buffer the growing field dielectric 50. By buffering field dielectric 50 during its growth, rounding of a silicon corner of active mesa 42 is minimized.

Both FIGS. 9 and 10 illustrate a benefit of using grown oxide as field dielectric 50. As oxide grows, the initial silicon boundary 72 extends into the silicon, leaving a finalized boundary 74. By moving the silicon boundary laterally and downward, especially at the corners according to the square root of the squared sum, critical dimension 70 is increased. Accordingly, not only does thermally grown oxide produce a dielectric of low permittivity, but also reduces the capacitive coupling in critical dimension areas directly above trenches 45.

It will be appreciated to those skilled in the art having the benefit of this disclosure that this invention is capable of applications with numerous types of MOS-processed circuits. Furthermore, it is to be understood that the form of the invention shown and described is to be taken as presently preferred embodiments. Various modifications and changes may be made to each and every processing step as would be obvious to a person skilled in the art having the benefit of this disclosure. It is intended that the following claims be interpreted to embrace all such modifications and changes and, accordingly, specification and drawings are regarded in an illustrative rather than a restrictive sense.

What is claimed is:

1. A method for forming a field dielectric, comprising:
   providing a silicon substrate having active regions laterally spaced apart by a field region;
   forming an oxidation barrier layer across said silicon substrate;
   etching through portions of said oxidation barrier layer and said field region to form a first trench laterally spaced from a second trench by a field mesa, wherein said first trench is arranged immediately adjacent a first one of said active regions and said second trench is arranged immediately adjacent a second one of said active regions, and wherein said field mesa extends from said first trench to said second trench;
   removing said oxidation barrier layer from upon said field mesa while retaining said oxidation barrier layer upon said active regions; and
   growing a field dielectric upon said field mesa and within said first trench and said second trench, wherein said oxidation barrier layer substantially inhibits said field dielectric from growing upon said active regions arranged immediately adjacent said first trench and said second trench.

2. The method as recited in claim 1, wherein said silicon substrate comprises single crystalline silicon.

3. The method as recited in claim 1, wherein said etching comprises:
   depositing photoresist across said oxidation barrier layer and thereafter selectively removing said photoresist; and
   etching said oxidation barrier layer and said silicon substrate in regions removed of said photoresist to a depth between 0.3 to 0.5 $\mu$m below an upper surface of said silicon substrate.

4. The method as recited in claim 1, wherein said growing comprises:
   exposing a silicon surface of said field mesa to an oxidizing ambient.

5. The method as recited in claim 4, wherein said oxidation barrier layer comprises a layer of nitride deposited upon a layer of oxide.

6. The method as recited in claim 4, wherein said oxidation barrier layer comprises a layer of polysilicon formed between a layer of oxide and a layer of nitride.

7. The method as recited in claim 1, wherein said growing comprises growing said field dielectric upon said field mesa to a thickness between 0.2 and 0.4 µm.

8. The method as recited in claim 1, wherein said growing comprises completely filling said first trench and said second trench with said field dielectric.

9. The method as recited in claim 8, wherein each of said first trench and said second trench comprise s width of approximately 0.1 to 1.0 µm.

10. A method for forming a field dielectric, comprising:

providing a silicon substrate having a pair of active regions separated by a field region;

forming an oxidation barrier layer across said silicon substrate;

depositing photoresist across said oxidation barrier layer and thereafter selectively removing said photoresist from above a pair of trench regions arranged within said field region immediately adjacent said pair of active regions;

etching portions of said oxidation barrier layer and said silicon substrate in said pair of trench regions to form a first trench laterally spaced from a second trench by a field mesa, wherein said first trench is arranged immediately adjacent one of said pair of active regions and said second trench is arranged immediately adjacent another of said pair of active regions, wherein said field mesa extends from said first trench to said second trench, and wherein said first trench and said second trench each extend below an upper surface of said silicon substrate by 0.2 to 0.5 µm;

removing said oxidation barrier layer from upon said field mesa while retaining said oxidation barrier layer upon said pair of active regions; and exposing a silicon surface of said field mesa to an oxidizing ambient to form a field dielectric upon said field mesa, wherein said oxidation barrier layer substantially inhibits said field dielectric from growing upon said pair of active regions arranged immediately adjacent said first trench and said second trench.

11. The method as recited in claim 10, wherein said field dielectric is approximately 0.2 to 0.4 µm in thickness upon said field mesa.

12. The method as recited in claim 10, wherein each of said trench regions is approximately 0.1 to 1.0 µm wide.

13. The method as recited in claim 10, wherein said exposing comprises completely filling said first trench and said second trench with said field dielectric.

14. The method as recited in claim 1, wherein said etching further comprises forming a second field mesa extending between a third trench and a fourth trench, wherein said third trench is immediately adjacent a third one of said active regions and said fourth trench is immediately adjacent a fourth one of said active regions, and wherein said first one of said active regions is separated from said second one of said active regions by said first and second trenches and said first field mesa, and wherein said third one of said active regions is separated from said fourth one of said active regions by said third and fourth trenches and said second field mesa, wherein said first and second ones of said active regions are spaced more than 16 microns apart and said third and fourth ones of said active regions are spaced less than 5 microns apart.

15. The method as recited in claim 14, wherein said second one of said active regions and said third one of said active regions are the same one of said active regions.

16. The method as recited in claim 14, wherein said first, second, third and fourth trenches all have the same width.

17. A semiconductor isolation method, comprising:

providing a silicon substrate having a first field region extending from a first active region to a second active region, wherein said first active region is spaced more than 16 microns from said second active region by said first field region;

forming a first trench immediately adjacent said first active region and a second trench immediately adjacent second active region to form a first field mesa within said first field region, wherein said first field mesa extends from said first trench to said second trench; and growing a field dielectric upon said first field mesa and within said first and second trenches while inhibiting said field dielectric from growing on said first and second active regions.

18. A semiconductor isolation method, comprising:

providing a silicon substrate having active regions laterally spaced apart by a field region;

forming an oxidation barrier layer across said silicon substrate, wherein said oxidation barrier layer comprises a layer of polysilicon formed between a layer of oxide and a layer of nitride;

etching through portions of said oxidation barrier layer and said field region to form a first trench laterally spaced from a second trench by a field mesa, wherein said first trench is arranged immediately adjacent a first one of said active regions and said second trench is arranged immediately adjacent a second one of said active regions;

removing said oxidation barrier layer from upon said field mesa while retaining said oxidation barrier layer upon said active regions; and growing a field dielectric upon said field mesa and within said first trench and said second trench, wherein said oxidation barrier layer substantially inhibits rounding of corners of said active regions adjacent said first trench and said second trench.

* * * * *

UNITED STATES PATENT AND TRADEMARK OFFICE
CERTIFICATE OF CORRECTION

PATENT NO. : 5,899,727
DATED : May 4, 1999
INVENTOR(S) : Fred N. Hause, Basab Bandyopadhyay, H. Jim Fulford, Jr., Robert Dawson, Mark W. Michael and William S. Brennan It is certified that error appears in the above-indentified patent and that said Letters Patent is hereby corrected as shown below:

In the Claims:

Claim 9, col. 9, line 14, after "comprise", please delete "s" and insert --a-- in place thereof.

Signed and Sealed this

Second Day of November, 1999

Attest:

Q. TODD DICKINSON

Attesting Officer

Acting Commissioner of Patents and Trademarks